US010310033B2

(12) United States Patent
Kundner et al.

(10) Patent No.: US 10,310,033 B2
(45) Date of Patent: Jun. 4, 2019

(54) PLUG CONNECTOR FOR USE IN A MAGNETIC RESONANCE DEVICE

(71) Applicants: Thomas Kundner, Buckenhof (DE); Wolfgang Kraus, Nürnberg (DE)

(72) Inventors: Thomas Kundner, Buckenhof (DE); Wolfgang Kraus, Nürnberg (DE)

(73) Assignee: Siemens Healthcare GmbH, Erlangen (DE)

( * ) Notice: Subject to any disclaimer, the term of this patent is extended or adjusted under 35 U.S.C. 154(b) by 33 days.

(21) Appl. No.: 15/706,995

(22) Filed: Sep. 18, 2017

(65) Prior Publication Data
US 2018/0088192 A1 Mar. 29, 2018

(30) Foreign Application Priority Data

Sep. 23, 2016 (EP) ..................................... 16190403

(51) Int. Cl.
*G01V 3/00* (2006.01)
*G01R 33/3415* (2006.01)
(Continued)

(52) U.S. Cl.
CPC ....... *G01R 33/3415* (2013.01); *G01R 33/288* (2013.01); *G01R 33/34007* (2013.01);
(Continued)

(58) Field of Classification Search
CPC .................................................. G01R 33/3415
(Continued)

(56) References Cited

U.S. PATENT DOCUMENTS 3,521,216 A 7/1970 Tolegian
4,355,856 A * 10/1982 Porter .................... H01R 12/87
439/437
(Continued)

FOREIGN PATENT DOCUMENTS

CN 2559133 Y 7/2003
CN 103427257 A 12/2013
(Continued)

OTHER PUBLICATIONS

European Office Action for European Patent Application No. 16190403.2-1568, dated Dec. 13, 2017.
(Continued)

*Primary Examiner* — Louis M Arana
(74) *Attorney, Agent, or Firm* — Lempia Summerfield Katz LLC

(57) ABSTRACT

A plug connector is disclosed for use in a magnetic resonance device. The plug connector includes a first connecting part and a second connecting part, which are configured to be detachably connected to one another. The first connecting part includes a first contact surface and the second connecting part includes a first contact plate, a second contact plate, and a housing. The second contact plate is arranged to be moved relative to the housing. In a connected state, the first contact plate is arranged between the first contact surface and the second contact plate. The electrical plug connector includes a mechanical lifting apparatus, which is configured, when the first connecting part is being connected to the second connecting part, to move the second contact plate, e.g., relative to the housing, in the direction of the first contact plate.

15 Claims, 5 Drawing Sheets

(51) Int. Cl.
  *G01R 33/28* (2006.01)
  *G01R 33/34* (2006.01)
  *G01R 33/36* (2006.01)
  *H01R 12/91* (2011.01)
  *G01R 33/563* (2006.01)
  *H01R 13/631* (2006.01)

(52) U.S. Cl.
  CPC ......... *G01R 33/36* (2013.01); *G01R 33/3642* (2013.01); *G01R 33/3664* (2013.01); *H01R 12/91* (2013.01); *G01R 33/56383* (2013.01); *H01R 13/6315* (2013.01)

(58) Field of Classification Search
  USPC .......................... 439/296–373; 324/318, 322
  See application file for complete search history.

(56) References Cited

U.S. PATENT DOCUMENTS

| | | | |
|---|---|---|---|
| 5,374,197 A * | 12/1994 | Uratsuji | ............... H05K 7/1007 439/330 |
| 6,062,886 A | 5/2000 | Chen | |
| 7,641,489 B1 | 1/2010 | Hsu et al. | |
| 2012/0126815 A1 | 5/2012 | Hahn | |
| 2013/0184563 A1 | 7/2013 | Driemel | |
| 2013/0337673 A1 | 12/2013 | King et al. | |
| 2017/0338599 A1 | 11/2017 | Hemmerlein et al. | |
| 2018/0351296 A1 * | 12/2018 | Driemel | ................. G01R 33/36 |

FOREIGN PATENT DOCUMENTS

| | | |
|---|---|---|
| DE | 2008420 A1 | 9/1971 |
| DE | 102011079565 A1 | 1/2013 |
| DE | 102016208847 A1 | 11/2017 |
| EP | 2667459 A1 | 11/2013 |
| FR | 2873237 A1 | 1/2006 |
| FR | 2991111 A1 | 11/2013 |
| WO | WO2015196210 A1 | 12/2015 |

OTHER PUBLICATIONS

European Search Report for related European Application No. 16190403.2 dated Apr. 20, 2017.

* cited by examiner

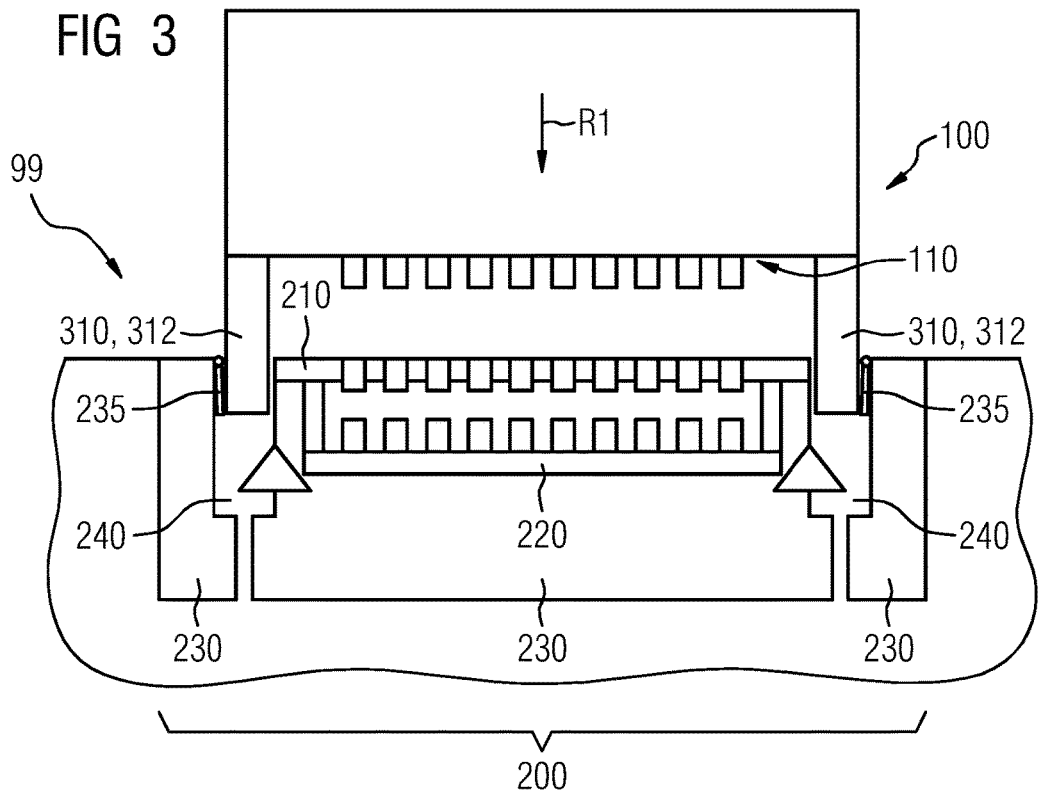
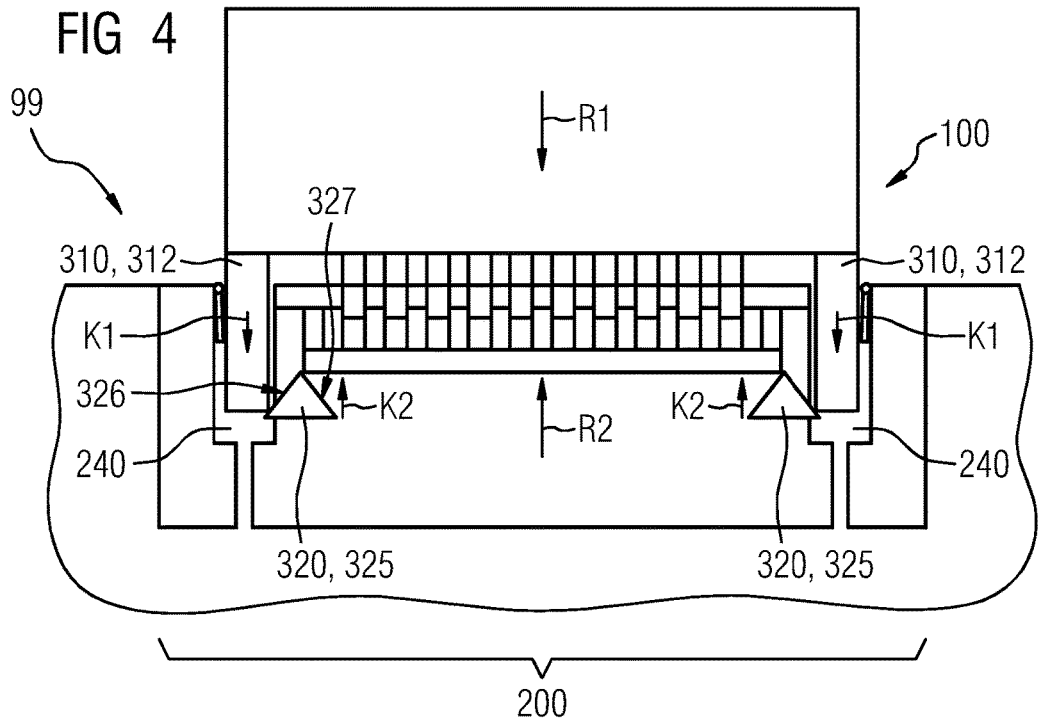

FIG 5
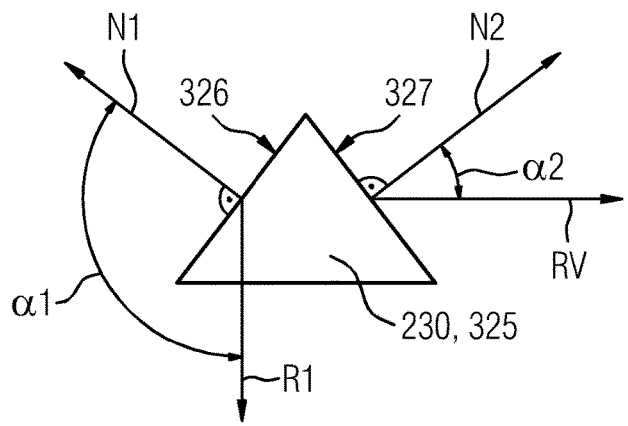
FIG 6
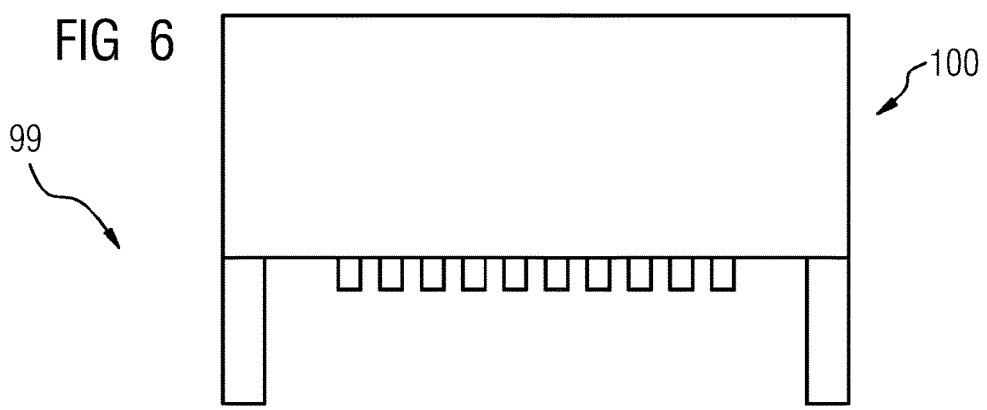
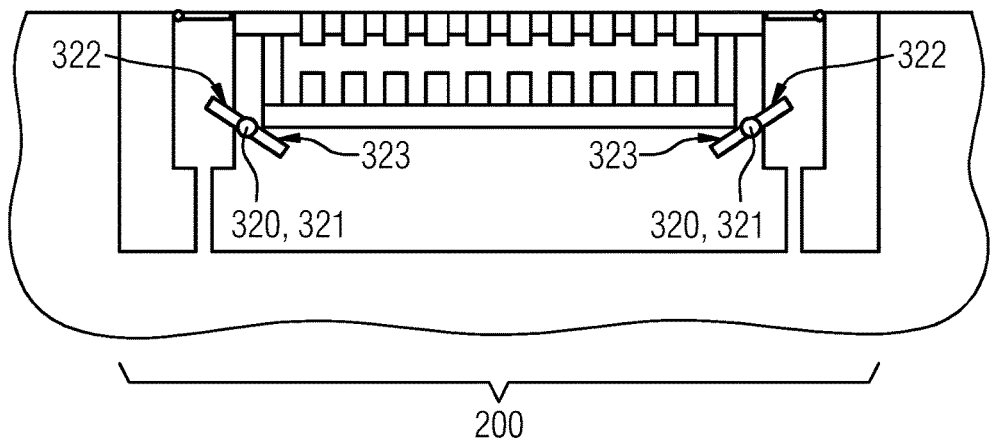

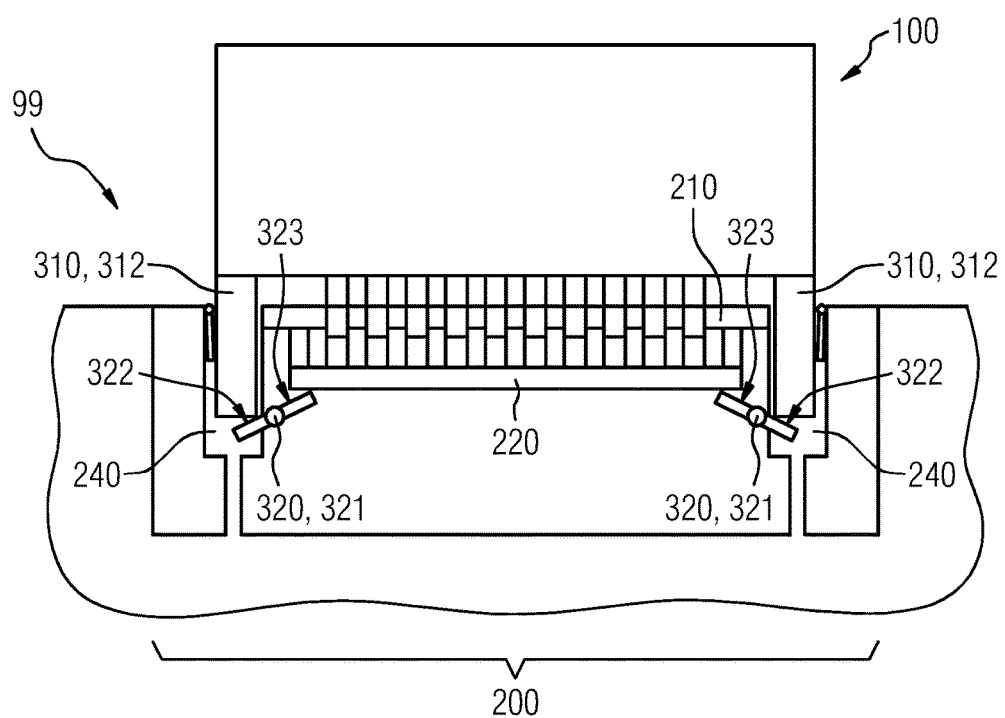

PLUG CONNECTOR FOR USE IN A MAGNETIC RESONANCE DEVICE

The application claims the benefit of European Patent Application No. EP 16190403.2, filed Sep. 23, 2016, incorporated by reference in its entirety.

TECHNICAL FIELD

The disclosure relates to a plug connector for use in a magnetic resonance device, to a first and a second connecting part of the plug connector, to a patient couch, a local coil, and a magnetic resonance device.

BACKGROUND

Medical technology imaging by magnetic resonance (MR), also called Magnetic Resonance Imaging (MRI), is characterized by high and variable soft tissue contrasts. Excitation pulses are irradiated into a patient with the aid of a magnetic resonance device, which trigger magnetic resonance signals in the patient. The magnetic resonance signals are received by electrically-conductive loops, so-called coils and/or antennas. In this process, a voltage is induced in the coil by the magnetic resonance signal. The induced voltage may be forwarded to receive electronics of the magnetic resonance device amplified by a low-noise preamplifier.

The receive coils may be arranged as close as possible to the patient. These are therefore also referred to as local coils. The local coils may not have a fixed connection to the magnetic resonance device, but are connected to the magnetic resonance device via a plug connector.

Conventional plug connectors may include a first connecting part on the coil side, (e.g., a plug on a cable of the local coil), and a second connecting part on the device side, (e.g., a socket on a patient couch of the magnetic resonance apparatus).

The coil-side plug may include contact elements, (e.g., contact pins pointing outwards), which are readily able to be touched. Thus, the danger of mechanical damage exists, such as through bending of the contact pins.

The socket corresponding to the plug may include contact elements, for example, contact openings pointing inwards. The contact elements may be arranged in an insulating body, e.g., pressed into the insulating body. The socket may further include a cover, for example, with a spring-loaded displacement mechanism. The cover may protect against direct touch contact with the contact elements and/or against the intrusion of liquids. In particular, contact openings in the socket may be arranged set back, in order to further enhance protection against accidental touch contact.

With an open cover in particular, liquids may still get into the insulating body and lead to corrosion of a circuit board, which might possibly be connected to it for example. In addition, liquid residues of cleaning agents may remain in the socket after cleaning, which may cause a material to become brittle, because the cleaning agents collect in recesses of the socket and may have a long-term effect.

Publication FR 2 873 237 A1 discloses a waterproof plug connector with two connecting units. The connecting units include a movable protective cover with electrically-conductive inserts. The connecting units further include fixed-location contacts inside the housing. During connection of the connecting units, protective covers are moved from the outside inwards in order to establish contact between the electrically-conductive inserts of the protective covers and the fixed-location contacts.

Publication U.S. Pat. No. 6,062,886 discloses a similar waterproof plug connector, in which a socket has internally-arranged, fixed-location terminals and a flexible cover with conductive hollow legs. On connection of the plug connector a plug is introduced into the legs and the flexible cover is pushed inwards inside the socket, in order to push the legs into the terminals.

SUMMARY AND DESCRIPTION

The underlying object of the disclosure is to specify a liquid-proof, MR-compatible plug connector, which is convenient to handle, (e.g., easy to clean).

The scope of the present disclosure is defined solely by the appended claims and is not affected to any degree by the statements within this description. The present embodiments may obviate one or more of the drawbacks or limitations in the related art.

Accordingly, a plug connector for use in a magnetic resonance device is proposed. The plug connector includes a first connecting part and a second connecting part, which are embodied to be connected detachably to one another. The first connecting part includes a first contact surface and the second connecting part includes a first contact plate, a second contact plate, and a housing. The second contact plate is arranged movably relative to the housing. In a connected state, the first contact plate is arranged between the first contact surface and the second contact plate. In addition, the electrical plug connector includes a mechanical lifting apparatus, which is embodied, when the first connecting part is connected to the second connecting part, to move the second contact plate, (e.g., relative to the housing), in the direction of the first contact plate.

The first connecting part may be included in a manual cable plug. The second connecting part may be included in a plug panel, (e.g., a patient couch). The first connecting part and the second connecting part may be brought into contact to establish a connection with one another and/or be detached from one another to disconnect a connection. The plug connector may be configured, for disconnecting and/or connecting lines via which, for example, magnetic resonance signals may be transmitted. Because the plug connector is intended for use in a magnetic resonance device, the plug connector may include exclusively MR-compatible, (e.g., non-magnetic), materials.

The plug connector may be an electrical plug connector, e.g., in the connected state at least one electrical contact is established between the first connecting part and the second connecting part. Electrical signals and/or electrical energy may be transmitted via the at least one contact.

The first contact plate may be arranged on the outer side on the second connecting part, while the second contact plate is arranged inside in the housing. During connection, there may be a movement of the second contact plate from the inside outwards, e.g., the movable second contact plate is arranged in an unconnected state inside at a certain distance from the first contact plate and is moved outwards to establish a connection, in order for it to contact the first contact plate. In the unconnected state, the first contact plate and the second contact plate are thus galvanically disconnected. The second connecting part may be embodied rigidly towards the outside by the movement of the second contact plate lying inside, in particular, for canceling the galvanic disconnection, (e.g., the second connecting part does not have a flexible and/or movable surface). This enables the second connecting part, (e.g., the surface of the second connecting part), to be cleaned more easily.

For movable arrangement of the second contact plate in the housing, the housing may include a guide unit, which has a linear guide and/or a shaft, for example, in which the second contact plate is movably supported.

The first contact plate may include an outer surface and an inner surface, which lie opposite one another, for example, as in a circuit board. In the connected state, the outer surface of the first contact plate may face towards the first contact surface of the first connecting part. In particular, the outer surface of the first contact plate touches the contact surface of the first connecting part in the connected state. Further, in the connected state, the inner surface of the first contact plate may touch the second contact plate. In addition, the first contact plate may have at least one element via, by which the contact surface of the first connecting part is able to be contacted with the second contact plate in the connected state.

The housing also possibly has an outer surface, which in the connected state faces towards the first contact surface of the first connecting part. The outer surface of the second connecting part, in particular, of the first contact plate and/or possibly of the housing, advantageously have a smooth and/or a coherent surface, so that this may be easily cleaned. A smooth surface may be seen here as a surface of which the maximum elevations are less than 5 mm, or less than 1 mm. In particular, the first contact plate may include at least one contact element and an insulation element, in which the at least one contact element is arranged, wherein the at least one contact element is arranged on the outer surface flush with the insulating body.

The first contact plate may be arranged in a fixed location in relation to the housing of the second connecting part, e.g., the housing may be connected rigidly to the first contact plate. The first contact plate may also be connected at least partly monolithically to the housing of the second connecting part, e.g., at least a part of the first contact plate, in particular the insulating body, and the housing are embodied in one piece. The contact plate may be injected into the housing and/or be attached to the housing with seals. The housing may be at least partly plastic.

In particular, the fixed-location arrangement denotes that there is no relative movement between the first contact plate and the housing. However, this does not exclude the first contact plate having inside elements and/or elements pointing into the inside of the housing, which are arranged movably relative to the first contact plate, in particular, spring-loaded.

As already described, it is made possible by the movable arrangement of the second contact plate, for the second contact plate to be spaced away from the first contact plate in an unconnected state. Thus, a galvanic separation between the first and second contact plate may be achieved. The spacing may be established in accordance with air gap and creepage requirements. The galvanic separation enables safety in the handling of the plug connector to be enhanced, in particular, when an electrical voltage is applied to the second contact plate. No further cover is thus necessary in order to guarantee accidental touch contact protection in relation to a patient.

The spacing between the second contact plate and the first contact plate may be changed by moving the second contact plate relative to the housing. The mechanical lifting apparatus may have the effect, when the first connecting part is being connected to the second connecting part, e.g., during a change from an unconnected state into a connected state, of reducing the distance between the second contact plate and the first contact plate. The distance may be reduced during connection to the extent that, in the contacted state, the first and the second contact plate are touching. This enables the galvanic separation between the first and second contact plate to be removed.

When the first connecting part is connected to the second connecting part, the first connecting part, (e.g., relative to the housing of the second connecting part), may move in a first connecting direction and the second contact plate of the second connecting direction moves in a second connecting direction, (e.g., relative to the housing of the second connecting part), wherein the first connecting direction and the second connecting direction enclose an angle of at least 90°, at least 120°, or at most 180°. In particular, the first connecting direction and the second connecting direction are opposed to one another, e.g., they enclose an angle of 180°.

Thus, a galvanic separation between the first and the second contact plate may be removed immediately on connection of the first connecting part to the second connecting part.

It is further proposed that the lifting apparatus is embodied, when the first connecting part is connected to the second connecting part, to transmit a mechanical force from the first connecting part to the second contact plate. In particular, the lifting apparatus does not use a magnetic force, because this would not be suitable for use in a magnetic resonance device.

The mechanical force may be transmitted without the involvement of the first contact plate, e.g., the force does not flow via the first contact plate. The mechanical force enables the second contact plate to be moved in the direction of the first contact plate.

One form of embodiment makes provision for the lifting apparatus to include a first lifting apparatus part and a second lifting apparatus part, wherein the first connecting part includes the first lifting apparatus part and the second connecting part includes the second lifting apparatus part. In this embodiment, when the first connecting part is connected to the second connecting part, a first mechanical force is introduced into the second lifting apparatus part by the first lifting apparatus part, so that a second mechanical force will be introduced into the second contact plate by the second lifting apparatus part. This enables the second contact plate to be moved in the direction of the first contact plate.

The force may flow from the first lifting apparatus part via the second lifting apparatus part to the second contact plate. The lifting apparatus is advantageously constructed so that the first lifting apparatus part, the second lifting apparatus part and the contact plate interact in such a way that, on connection of the first connecting part to the second connecting part, the second contact plate is moved in the direction of the first contact plate.

The first mechanical force may be aligned differently from the second mechanical force, e.g., the lifting apparatus causes a deflection of the first mechanical force triggering the movement of the second contact plate.

At least one component of the first mechanical force is aligned in parallel to the first connecting direction and/or the at least one component of the second mechanical force is aligned in parallel to the second connecting direction.

The housing of the second connecting part may have a recess, wherein the first lifting apparatus part includes at least one projecting element, which is able to be arranged in the at least one recess of the housing. The at least one recess may be arranged next to the first contact plate.

The at least one recess may have a longitudinal, (e.g., cylindrical), geometry. The longitudinal geometry may have a long axis. The long axis may be parallel to the first connecting direction. The geometry of the at least one recess may bring about a forced guidance of the first connecting part on connection to the second connecting part.

The first contact plate may have a main extent surface. The long axis of the geometry of the recess may enclose an angle with the normal of the main extent surface of the first contact plate of at most 90°. In particular, the long axis of the geometry of the recess encloses an angle with the normal of the main extent surface of the first contact plate of approximately 0°, e.g., the long axis is oriented at right angles to the main extent surface of the first contact plate.

The at least one recess may have at least one recess opening, through which the at least one projecting element, (e.g., a cylindrical pin), is able to be pushed into the at least one recess. At least a part of the second lifting apparatus part may be arranged in and/or on the at least one recess. When the at least one projecting element is pushed into the at least one recess, a mechanical force, (e.g., the first mechanical force), may advantageously be introduced into the second lifting apparatus part by the projecting element.

The second connecting part may include at least one recess cover in order to cover the at least one recess opening of the at least one recess in an unconnected state. This indicates that liquids and/or dirt may not enter the at least one recess or may only enter to a small extent. Advantageously, it is arranged so that it may be moved, (e.g., folded away), so that the at least one projecting element may penetrate into the at least one recess on connection of the first connecting part to the second connecting part.

The at least one recess cover may be configured so that, in the unconnected state, it is flush with the surface surrounding it and is only opened during connection.

The second connecting part may include a diversion unit, which is embodied to divert any foreign substances, (e.g., liquids and/or dirt), out of the at least one recess. The diversion unit may include one or more diversion channels leading outwards. The diversion unit may be arranged on a side of the at least one recess spaced away from the recess opening, e.g., lying opposite it. The possible foreign substances may be diverted downwards by the force of gravity, if the second connecting part is aligned so that the at least one recess opening points upwards.

The at least one recess may be inserted into a separate area of the housing which is open downwards, so that liquids that penetrate may be diverted directly. These areas may be embodied so that cleaning is easily possible with normal aids, e.g., cotton buds.

Advantageously, the second connecting part is embodied such that no foreign substances may reach the first contact plate from the at least one recess. This enables the foreign substances to be prevented from coming into contact with any electrically active components of the second connecting part and causing a short circuit for example.

The second lifting apparatus part may include at least one rocker and/or at least one lifting wedge. These elements are especially suitable for transferring a mechanical force, (e.g., the first mechanical force), from the first connecting part to the second contact plate. These elements make it possible to divert the mechanical force, e.g., a non-linear flow of force. A non-linear flow of force enables the second contact plate to be moved in a direction, (e.g., in the second connecting direction), which differs from the direction of movement of the first connecting part, (e.g., of the first connecting direction), during connection of the plug connector.

One form of embodiment of the plug connector makes provision for the at least one rocker to have a first rocker surface and a second rocker surface, wherein on introduction of the mechanical force, (e.g., of the first mechanical force), into the first rocker surface, the second rocker surface is rotated. The rotation enables a mechanical force, (e.g., the second mechanical force), to be introduced into the second contact plate. Through an introduction of a mechanical force into an object the mechanical force acts on the object, e.g., the mechanical force engages with the object.

The rocker may be supported rotatably in the housing, in order to make the rotation of the rocker possible. The first rocker surface and the second rocker surface may be rigidly connected to one another, in particular embodied in one piece. This enables the mechanical force to be transmitted from the first rocker surface to the second rocker surface especially effectively.

A further form of embodiment of the plug connector makes provision for the at least one lifting wedge to have a first wedge surface, wherein the at least one lifting wedge is arranged and/or is embodied such that the first lifting apparatus part, when the first connecting part is connected to the second connecting part, is moved in a direction, (e.g., in the first connecting direction), which encloses a first angle of inclination with the normal of the first wedge surface of greater than 0°, (e.g., greater than 20°), and less than 90°, (e.g., less than 70°).

On connection of the first connecting part with the second connecting part, this enables the at least one lifting wedge, on introduction of a mechanical force, (e.g., of the first mechanical force), to the first wedge surface, to be moved in a direction of displacement different to the direction of movement of the first lifting apparatus part. The mechanical force may be introduced into the first wedge surface by the projecting element.

Advantageously, the first wedge surface acts as an inclined plane, which diverts a mechanical force. The first mechanical force may be broken down by the inclined plane into a number of portions, wherein one of the portions is aligned in parallel to the direction of displacement.

The first angle of inclination may be configured so that, when a mechanical force is introduced, a possible tilting of the at least one lifting wedge does not occur. Further the first angle of inclination may be configured so that any friction forces are overcome, which, with an unfavorable choice of the first angle of inclination, would prevent the at least one lifting wedge from moving.

The at least one lifting wedge may have a second wedge surface, of which the normal encloses a second angle of inclination greater than 0°, (e.g., greater than 20°), and less than 90°, (e.g., less than 70°), in relation to the direction of displacement.

This enables a mechanical force, (e.g., the second mechanical force), to be introduced by the second wedge surface into the second contact plate, whereby the second contact plate may be moved in a direction different from the direction of displacement, (e.g., in the second connecting direction). This may be done in accordance with the previously described principle of splitting up a force with the aid of an inclined plane. In this case, the second wedge surface may run in the opposite direction to the first wedge surface.

The second angle of inclination may be configured so that, when a mechanical force is introduced, a possible tilting of the at least one lifting wedge does not occur, and/or that any friction forces are overcome, which with an unfavorable choice of the second angle of inclination would prevent the at least one lifting wedge from moving.

The first wedge surface and the second wedge surface may be rigidly connected to one another, in particular embodied in one piece. This enables the mechanical force to be transmitted from the first wedge surface to the second wedge surface especially effectively.

The lifting apparatus may be embodied so that the first connecting direction and/or the second connecting direction are at right angles to the direction of displacement. This would produce a right-angled flow of force from the first connecting part, (e.g., the possible at least one projecting element), to the second contact plate.

The second connecting part may include a spring unit, which exerts a repelling force between the second contact plate and the first contact plate. It may thus be provided that the first contact plate is spaced away from the second contact plate in the unconnected state, in particular galvanically separated.

When the plug connector is connected, the second contact plate may be moved against the spring pressure of the spring unit and/or pressed against the inner surface of the first contact plate. When the plug connector is disconnected, advantageously the second contact plate is moved away from the first contact plate again, for example via the spring unit and thereby a galvanic separation is undertaken automatically.

The spring unit may include at least one compression spring. Compression springs are readily available and are able to be integrated especially well into the second connecting part.

The plug connector may include a latching facility, so that in the contacted state permanent contacting, in particular, against the possible counter pressure by the spring unit, may be provided.

It is further proposed that the first contact surface has at least one first electrical contact element, the first contact plate has at least one second electrical contact element, and the second contact plate has at least one third electrical contact element. In this case, in the connected state, the at least one first electrical contact touches the at least one second electrical contact and the at least one second electrical contact touches the at least one third electrical contact.

This enables an electrical connection to be established between the first plug connector part and the second plug connector part.

The contact elements may be non-magnetic in order not to cause any disruption during a magnetic resonance measurement.

The at least one first electrical contact element and/or the at least one second electrical contact element and/or the at least one third electrical contact element may have at least one spring contact, in particular, at least one spring pin contact and/or at least one stamped and bent contact.

Advantageously, the at least one second electrical contact element only has a spring contact on the inner surface of the first contact plate. On the outer surface, spring contacts may make it more difficult to clean the second connecting part. Spring contacts are further proposed for the first contact surface and the second contact plate, which may be each sprung against the first contact plate. The spring contacts of the first contact surface may be sprung against one side and/or the spring contacts of the second contact plate against another side of the first contact plate. In this way, for example, on connection, at least one sprung first and/or third contact element may be pressed against at least one unsprung second contact element.

The use of spring contacts indicates that a conventional "plugging in", as with classical male/female pin contacts, is not necessary. With the aid of sprung contact elements secure contacting may be created and manufacturing tolerances compensated for.

The first contact surface may have a number of first electrical contacts, which are arranged in a first pattern, and the first contact plate has a number of second electrical contacts, which are arranged in a second pattern, and the second contact plate has a number of third electrical contacts, which are arranged in a third pattern. In such cases, the first pattern, the second pattern, and the third pattern cover at least partly the same area.

The contact elements may be electrically insulated. This indicates that, in particular, an electrical connection including a number of channels may be established between the first plug connector part and the second plug connector part.

The patterns may form a two-dimensional matrix, wherein a signal conductor is in galvanic contact with a first contact element and three second contact elements adjacent to the first contact element, surrounding the first contact element are galvanically connected to a screen. This enables a well-screened electrical connection to be provided even without expensive coaxial contacts.

In addition, a first connecting part is proposed, which is embodied to make a plug connection with a second connecting part in accordance with one of the forms of embodiment previously described. Similarly, a second connecting part is proposed, which is embodied to make a plug connection with a first connecting part in accordance with one of the forms of embodiment previously described. The advantages of the first and of the second connecting part correspond to the advantages of the plug connector, which have been set out in detail above.

A patient couch with at least one second connecting part is also proposed. By being arranged close to a patient, a corresponding plug connector may be used for connection of local coils with short cables and/or of cableless local coils, (e.g., for direct connect local coils), as are described for example in publications DE 102011079565 A1 and/or U.S. Patent Publication No. 2012/0126815 A1. In particular, an integration of the at least one second connecting part into a patient couch makes an improved use and/or maintenance possible as a result of the advantages described above.

Signal lines of the patient couch and/or of a magnetic resonance device may be connected to the second connecting part, in particular, to the possibly at least one third electrical contact element of the second connecting part.

As described above, the second connecting part, (e.g., the first contact plate and/or the housing of the second connecting part), has an outer surface, which in the connected state faces towards the contact surface of the first connecting part. In addition, the patient couch has a patient support surface, which at least partly, (e.g., completely), surrounds the outer surface. The patient support surface may steplessly adjoin the connecting part surface, e.g., the transition from the patient support surface to the outer surface of the second connecting part does not include any step or steps of maximum 5 mm in height, or of maximum 1 mm in height.

In particular, the patient couch has a flush surface with the at least one second connecting part. In particular, the first contact plate and if necessary any housing that might possibly surround the first contact plate are arranged flush with the surface of the part of the patient couch surrounding the second connecting part. In particular, the patient support surface and the connecting part surface are at the same level.

The at least one recess cover may be, at least in the unconnected state, flush with the surface surrounding it. Advantageously, the at least one recess opening of the at least one recess is only opened on connection of the first connecting part to the second connecting part.

Such a stepless and/or flush arrangement of the surfaces makes it especially simple to clean the at least one second connecting part.

The patient couch may include electronics arranged below the second connecting part. The electronics may be installed into the patient couch encapsulated below the first contact plate. A closed surface of the second connecting part enables the electronics to be protected against mechanical damage and against the intrusion of dirt and/or liquids.

A local coil with at least one first connecting part is further proposed. The local coil may include at least one cable, on which the at least one first connecting part is arranged and/or the at least one first connecting part may be arranged directly in the housing of the local coil. As already mentioned, in this case the local coil may also be referred to as a direct connect coil.

A magnetic resonance device with at least one second connecting part is further proposed. Here too the reader is referred to the advantages already described.

BRIEF DESCRIPTION OF THE DRAWINGS

Further advantages, features and details of the disclosure emerge from the exemplary embodiments described below as well as with reference to the drawings. Parts that correspond to one another are labeled in all figures with the same reference characters.

FIG. 3 depicts a plug connector in an intermediate state in the first form of embodiment.

FIG. 4 depicts a plug connector in a connected state in the first form of embodiment.

FIG. 5 depicts a detailed diagram of the plug connector in the first form of embodiment.

FIG. 6 depicts a plug connector in an unconnected state in a further form of embodiment.

FIG. 7 depicts a plug connector in a connected state in a further form of embodiment.

DETAILED DESCRIPTION

Figure 1:
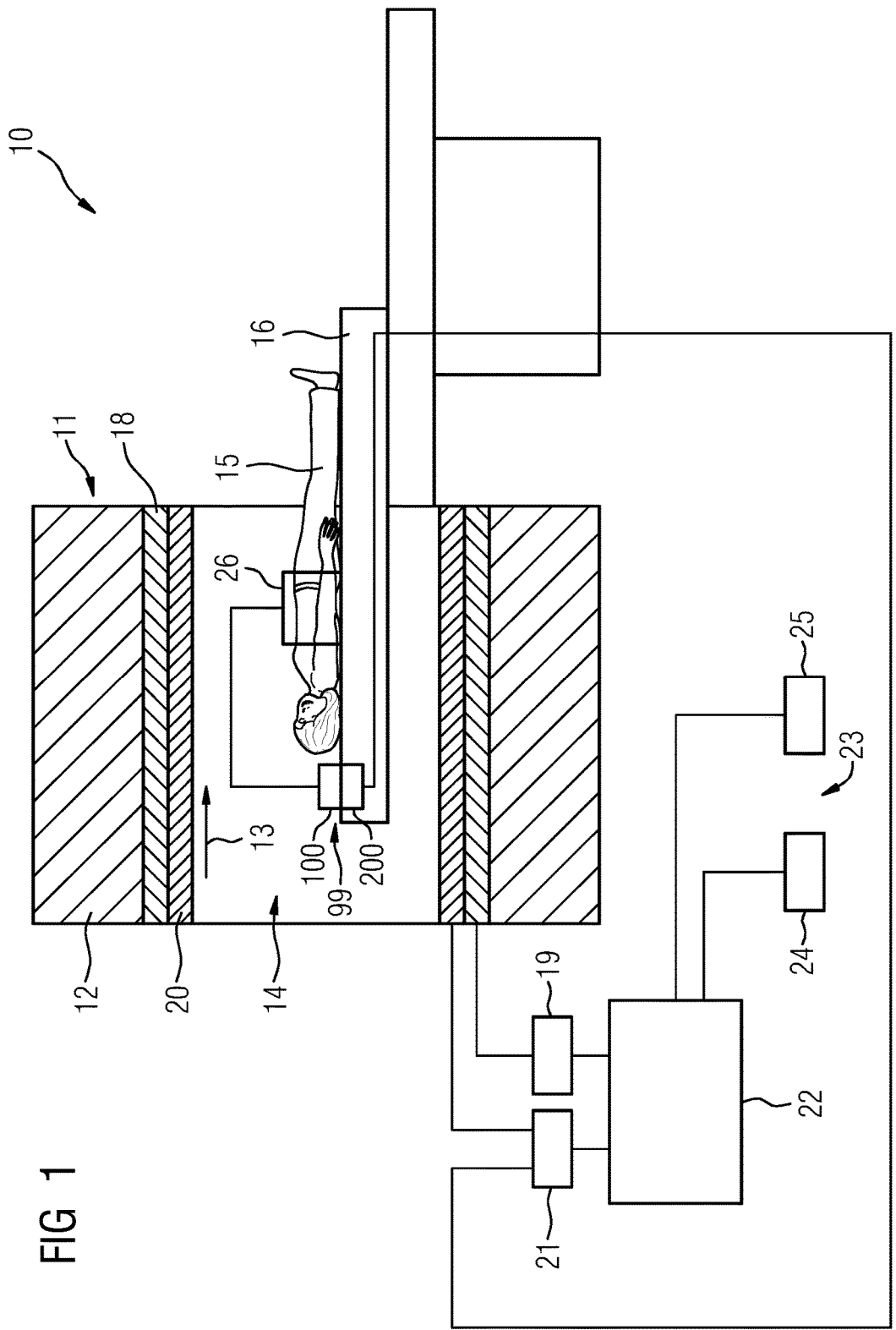
FIG. 1 depicts an example of a magnetic resonance device with a local coil, which is connected via a plug connector to the magnetic resonance device, in a schematic diagram.

FIG. 1 depicts a schematic diagram of a magnetic resonance device 10. The magnetic resonance device 10 includes a magnet unit 11, which has a superconducting main magnet 12 for creating a strong and, in particular, temporally-constant main magnetic field 13. In addition, the magnetic resonance device 10 includes a patient receiving area 14 for receiving a patient 15. The patient receiving area 14, in the present exemplary embodiment, is embodied in a cylindrical shape and is surrounded in a circumferential direction by the magnet unit 11 in the form of a cylinder. An embodiment of the patient receiving area 14 differing therefrom is also conceivable. The patient 15 may be pushed into the patient receiving area 14 by a patient couch 16 embodied so as to allow movement.

The magnet unit 11 also has a gradient coil unit 18 for creating magnetic field gradients, which are used for spatial encoding during imaging. The gradient coil unit 18 is controlled by a gradient control unit 19 of the magnetic resonance device 10. The magnet unit 11 further includes a radio-frequency antenna unit 20, which in the present exemplary embodiment is embodied as a body coil integrated permanently into the magnetic resonance device 10. The radio-frequency antenna unit 20 is designed for excitation of atomic nuclei that occur in the main magnetic field 13 created by the main magnet 12. The radio-frequency antenna unit 20 is controlled by a radio-frequency antenna control unit 21 of the magnetic resonance device 10 and radiates radio-frequency magnetic resonance sequences into an examination space, which is formed by a patient receiving area 14 of the magnetic resonance device 10. The radio-frequency antenna unit 20 is further embodied for receiving magnetic resonance signals.

The magnetic resonance device further includes a local coil 26, which is also embodied for receiving magnetic resonance signals. In this exemplary embodiment, the local coil 26 includes a cable, on the end of which a first connecting part 100 is arranged. The first connecting part 100 is connected here to a second connecting part 200, which is arranged in the patient couch 16. The first connecting part 100 and the second connecting part 200 are parts of a plug connector 99. The second plug connector is connected to the radio-frequency antenna control unit 21, so that magnetic resonance signals received by the local coil 26 may be forwarded.

For controlling the main magnet 12, the gradient control unit 19 and for controlling the radio-frequency antenna control unit 21, the magnetic resonance device 10 has a system control unit 22. The system control unit 22 centrally controls the magnetic resonance device 10, such as for example the carrying out of a predetermined imaging gradient echo sequence. In addition, the system control unit 22 has an evaluation unit not shown in any greater detail, for evaluating medical image data that is acquired during the magnetic resonance examination. Furthermore, the magnetic resonance device 10 has a user interface 23, which is connected to the system control unit 22. Control information such as for example imaging parameters, as well as reconstructed magnetic resonance images, may be displayed on a display unit 24, for example on at least one monitor, of the user interface 23 for medical operating personnel. The user interface 23 further includes an input unit 25, by which information and/or parameters may be entered by the medical personnel during a measurement process.

Figure 2:
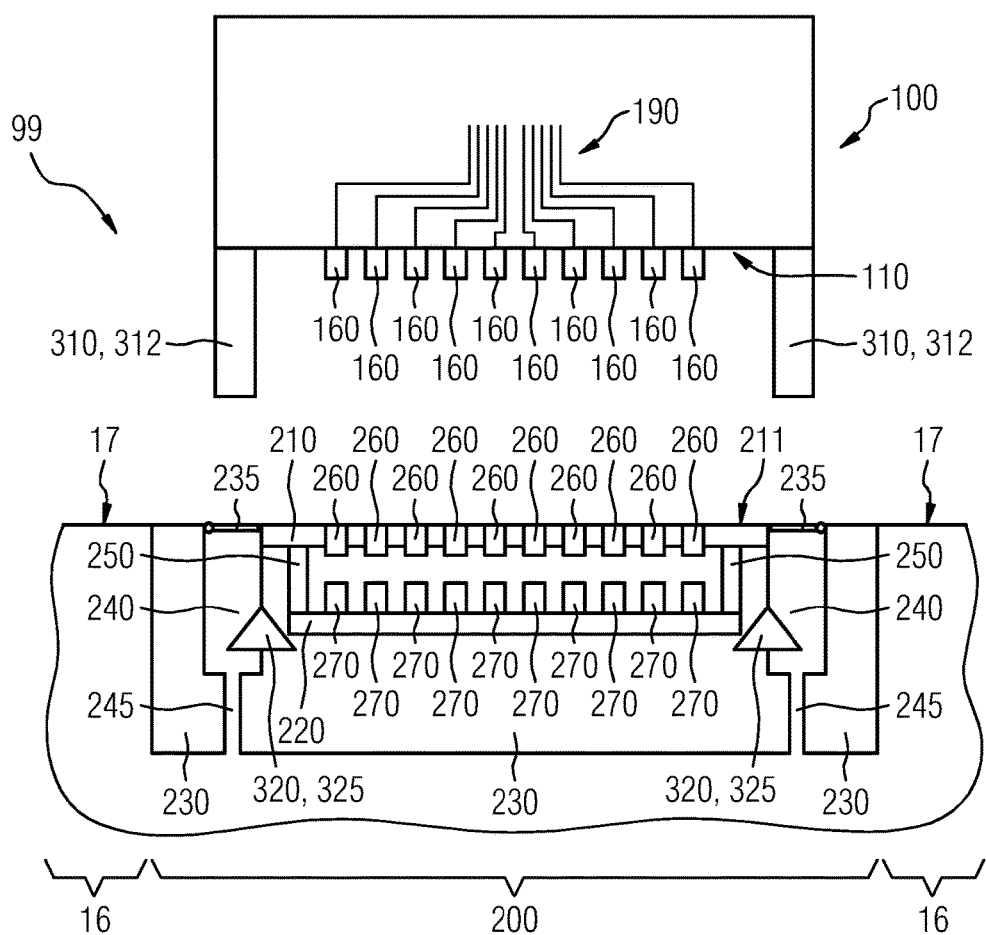
FIG. 2 depicts a plug connector in an unconnected state in a first form of embodiment.

FIG. 2 illustrates a first form of embodiment of the plug connector 99 in a sectional diagram. The plug connector 99 includes a first connecting part 100 and a second connecting part 200, which are embodied to be connected detachably to one another, wherein FIG. 2 depicts the plug connector 99 in an unconnected state.

The first connecting part 200 includes a first contact surface, which has a number of first electrical contact elements 160. It is also schematically indicated that the contact elements 160 are contacted with electrical lines 190, via which electrical signals and/or energy may be transported.

The second connecting part 200 includes a first contact plate 210, a second contact plate 220 and a housing 230. The second contact plate 220 is arranged movably relative to the housing 230, which is also evident from the further figures. By contrast, the first contact plate 210 is arranged at a fixed location on the housing.

The first contact plate 210 includes a number of second electrical contact elements 260 and the second contact plate a number of third electrical contact elements 270. The number of third electrical contacts 270 are also, like the number of first electrical contacts 160, connected to lines, but the lines have not been shown in the figure for reasons of improved clarity.

In the unconnected state, the first contact plate 210, and thus the number of second electrical contact elements 260, and the second contact plate 220, and thus the number of third electrical contact elements 260, are spaced away from one another and thus galvanically separated. The second connecting part 100 includes a spring unit 250, which exerts a repelling force between the second contact plate 220 and the first contact plate 210 and thus provides the spacing in the unconnected state. The spring unit 250 may include one or more compression springs for example.

Because FIGS. 2 to 7 involve sectional diagrams, it is naturally conceivable for the electrical contact elements 260 also to be arranged for example in a two-dimensional matrix at right angles to the plane of the diagram. The plug connector 99 may include further contact elements in sectional planes other than just those that are shown in the sectional plane presented.

In a connected state, such as is depicted by way of example in FIG. 4, each of the number of first electrical contacts 160 is touching one of the number of second electrical contacts 260 and for their part, each of the second electrical contacts 260 is touching one of the number of third electrical contacts 270. This enables electrical signals and/or energy to be transported via the plug connector 99 in a connected state.

It is also depicted in FIG. 2 that the first contact surface 110, the first contact plate 210 and the second contact plate each include an insulating body, which separates the contact elements from one another, in order to avoid a short circuit between the contact elements 160, 260, 270. No reference characters have been inserted for the insulating body for the sake of enhanced clarity of the figures. The insulating body of the first contact plate 210 may also be connected in such cases monolithically to the housing 230.

The plug connector also includes a mechanical lifting apparatus, which is embodied, when the first connecting part 100 is connected to second connecting part 200, to move the second contact plate 220 in the direction of the first contact plate 210. The lifting apparatus includes a first lifting apparatus part 310 and a second lifting apparatus part 320, wherein the first connecting part 100 includes the first lifting apparatus part 310 and the second connecting part 200 includes the second lifting apparatus part 320.

The first lifting apparatus part 310 here includes two projecting elements 312. To match these, the housing 230 of the second connecting part 200 has two recesses 240, in which the projecting elements may be arranged, as is depicted in FIGS. 3, 4, and 7. The second lifting apparatus part 320, in the first exemplary embodiment, includes two lifting wedges 325.

Here too it should be pointed out once again that the diagrams in FIGS. 2 to 7 involve sectional diagrams and further first and second lifting apparatus parts 310, 320 may be arranged in further sectional planes.

The recesses 240 are covered in the unconnected state by recess cover 235, so that as few foreign substances as possible, such as e.g. dirt, liquids etc., may penetrate into the recess. Any foreign substances penetrating into the recess despite this may be diverted out of the second connecting part again via a diversion unit, which here includes two diversion channels 245.

The first contact plate 210 and the housing have outer surfaces 211, which in a connected state, as depicted by way of example in FIG. 4, face towards the contact surface 110 of the first connecting part. In this case the outer surface of the first contact plate and of the housing has a smooth and/or coherent surface. This enables the second connecting part 200 to be easily cleaned.

FIG. 3 depicts an intermediate state between an unconnected state in accordance with FIG. 2 and a connected state in accordance with FIG. 4. The first connecting part 100, starting from the unconnected state, is moved relative to the housing 230 of the second connecting part 200 in a first connecting direction R1, so that the first contact surface 110 approaches the first contact plate 210.

In this case the projecting elements 310, 312 penetrate into the recesses 240. To make it possible for the projecting elements 310, 312 to penetrate into the recesses 240, the recess covers 235 are folded away from their original position, in which they are held by a spring, for example.

During the further course of connecting the first connecting part 100 to the second connecting part 200, the first lifting apparatus part 310, here the projecting elements 312, interacts with the second lifting apparatus part 320, here the lifting wedge 325, until a connected state exists, as is depicted in FIG. 4. The interaction causes a movement of the second contact plate 220 relative to the housing in a second connecting direction R2.

On connection of the first connecting part 100 to the second connecting part 200, the first connecting part 100 is thus moved in the first connecting direction R1 and the second contact plate 220 of the second connecting direction 200 is moved in the second connecting direction R2, wherein the first connecting direction and the second connecting direction are opposing directions, e.g., enclose an angle of 180°. However, forms of embodiment are also conceivable which provide for non-parallel movements of the first connecting part 100 and the second contact plate, e.g., the enclosed angle lies between 90° and 180°.

On connection of the first connecting part 100 to the second connecting part 200 by the first lifting apparatus part 310, in particular, a first mechanical force K1 is introduced into the second lifting apparatus part 320, so that a second mechanical force K2 will be introduced into the second contact plate 220 by the second lifting apparatus part 320.

A more detailed diagram of this example of a mechanical lifting mechanism, using a lifting wedge 320, 325, is depicted in FIG. 5. In this diagram, the lifting wedge 300, 325 depicted in FIG. 5 corresponds to the left-hand of two lifting wedges 300, 325 depicted in FIGS. 2 to 4.

The lifting wedge has a first wedge surface 326, wherein the lifting wedge is arranged and/or is embodied such that the first lifting apparatus part 310, here the projecting element 312, will be moved in a direction R1 on connection of the first connecting part 100 to the second connecting part 200, which encloses a first angle of inclination $a1$ greater than 90° and less than 180° with the normal N1 of the first wedge surface 326. The lifting wedge thereby experiences a force effect that is aligned at least partly at right angles to the direction R1. With the aid of a suitable forced guidance, the lifting wedge may thus be moved in a direction of displacement RV, which in this example is aligned at right angles to the direction R1.

The at least one lifting wedge 325 also has a second wedge surface 327, of which the normal N2 encloses a second angle of inclination $az$ greater than 0° and less than 90° in relation to a direction of displacement RV. Thereby the suitably arranged second experiences a force effect that is aligned at least partly at right angles to the direction R1. With the aid of a suitable forced guidance the lifting wedge may thus be moved in a direction of displacement RV, which in this example is aligned at right angles to the direction R1.

A further possible lifting mechanism is depicted in FIGS. 6 and 7. Here the second lifting apparatus part 320 includes two rockers 321.

FIG. 6 depicts an unconnected state, e.g., the first connecting part 100 and the second connecting part 200 are separated. The rockers each have a first rocker surface 322 and a second rocker surface 323. As is depicted in FIG. 7, by the introduction of the projecting elements 310, 312, the rockers will exert a mechanical force on the first rocker surface 322, so that the rockers 320, 321 and thereby also the second rocker surface 323 rotate.

The second rocker surface 323 is arranged on the second contact plate, so that this is moved by the rotation of the rockers 320, 321 in the direction of the first contact plate, until the contact plates are in contact with one another.

As indicated in FIGS. 4 and 7, the first contact surface and the second contact plate have spring contacts. This enables the first electrical contact elements 260 and the third electrical contact elements 270 to make spring contact when they touch the first contact plate, so that an especially reliable contacting to the second electrical contact elements is achieved.

In conclusion, it is pointed out once again that, for the plug connector described in detail above, as well as for the magnetic resonance device shown, it is only exemplary embodiments that are given, which may be modified by the person skilled in the art in a very wide variety of ways, without departing from the field of the disclosure. Furthermore, the use of the indefinite article "a" or "an" does not exclude the features concerned also being able to be present multiple times. Likewise, the term "unit" does not preclude the components involved also including a number of interacting sub-components, which may also be physically separated if necessary.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance device or a patient couch comprising:
    a plug connector comprising:
        a first connecting part having a first contact surface comprising at least one first electrical contact element;
        a second connecting part having a first contact plate comprising at least one second electrical contact element, a second contact plate comprising at least one third contact element, and a housing, wherein the second contact plate is configured to move relative to the housing, wherein the second connecting part is configured to be connected detachably to the first connecting part, and wherein, in a connected state, the first contact plate is arranged between the first contact surface and the second contact plate, the at least one first electrical contact element touches the at least one second electrical contact element, and the at least one second electrical contact element touches the at least one third electrical contact element; and
        a mechanical lifting apparatus configured to move the second contact plate in a direction of the first contact plate when the first connecting part is connected to the second connecting part.

2. The magnetic resonance device or the patient couch of claim 1, wherein the second connecting part has an outer surface, which, in the connected state of the contact surface, faces towards the first connecting part,
    wherein the outer surface of the first contact plate, the housing, or both the outer surface and the housing have a smooth surface, a coherent surface, or both smooth and coherent surfaces.

3. The magnetic resonance device or the patient couch of claim 1, wherein, on connection of the first connecting part to the second connecting part, the first connecting part moves in a first connecting direction and the second contact plate moves in a second connecting direction,
    wherein the first connecting direction and the second connecting direction enclose an angle of 90° to 180°.

4. The magnetic resonance device or the patient couch of claim 1, wherein the mechanical lifting apparatus is configured, when the first connecting part is being connected to the second connecting part, to transmit a mechanical force from the first connecting part to the second contact plate.

5. The magnetic resonance device or the patient couch of claim 1, wherein the mechanical lifting apparatus comprises a first lifting apparatus part and a second lifting apparatus part,
    wherein the first connecting part comprises the first lifting apparatus part and the second connecting part comprises the second lifting apparatus part, and
    wherein, when the first connecting part is being connected to the second connecting part, a first mechanical force is introduced into the second lifting apparatus part by the first lifting apparatus part so that a second mechanical force is introduced into the second contact plate by the second lifting apparatus part.

6. The magnetic resonance device or the patient couch of claim 5, wherein the housing of the second connecting part has at least one recess, and
    wherein the first lifting apparatus part comprises at least one projecting element configured to be arranged in the at least one recess of the housing.

7. The magnetic resonance device or the patient couch of claim 5, wherein the second lifting apparatus part comprises at least one rocker, at least one lifting wedge, or the at least one rocker and the at least one lifting wedge.

8. The magnetic resonance device or the patient couch of claim 7, wherein the at least one rocker has a first rocker surface and a second rocker surface, and
    wherein the second rocker surface is rotated when a mechanical force is introduced into the first rocker surface.

9. The magnetic resonance device or the patient couch of claim 7, wherein the at least one lifting wedge has a first wedge surface,
    wherein the at least one lifting wedge is configured so that the first lifting apparatus part is moved in a direction when the first connecting part is being connected to the second connecting part, which encloses a first angle of inclination greater than 90° and less than 180° with a normal of the first wedge surface.

10. The magnetic resonance device or the patient couch of claim 9, wherein the at least one lifting wedge has a second wedge surface of which a normal encloses a second angle of inclination greater than 0° and less than 90° in relation to a direction of displacement.

11. The magnetic resonance device or the patient couch of claim 1, wherein the second connecting part comprises a spring unit,
wherein the spring unit exerts a repelling force between the second contact plate and the first contact plate.

12. The magnetic resonance device or the patient couch of claim 11, wherein the spring unit comprises at least one compression spring.

13. The magnetic resonance device or the patient couch of claim 1, wherein one or more of the at least one first electrical contact element, the at least one second electrical contact element, or the at least one third electrical contact element has at least one spring contact.

14. The magnetic resonance device or the patient couch of claim 1, wherein the second connecting part has an outer surface, which, in the connected state, faces towards the first contact surface of the first connecting part,
wherein the patient couch has a patient support surface, which at least partly encloses the outer surface, and
wherein the patient support surface adjoins the outer surface steplessly.

15. A local coil comprising:
a plug connector;
a first connecting part having a first contact surface comprising at least one first electrical contact element; and
a second connecting part having a first contact plate comprising at least a second electrical contact element, a second contact plate comprising at least a third electrical contact element, and a housing, wherein the second connecting part is located moveably relative to the housing,
wherein the first connecting part and the second connecting part are configured for being detachably connected to one another,
wherein in a connected state, the first contact plate is located between the first contact surface and the second contact plate, the at least one first electric contact element touches the at least one second electric contact element, and the at least one second electric contact element touches the at least one third electric contact element,
wherein the first connecting part and the second connecting part are configured for entering the plug connector, wherein the plug connector is an electric plug connector, and
wherein the plug connector comprises a mechanical lifting apparatus, which is configured, in the connected state, to move the second contact plate in a direction of the first contact plate.

* * * * *